(12) United States Patent
Murakami

(10) Patent No.: US 12,074,088 B2
(45) Date of Patent: Aug. 27, 2024

(54) SEMICONDUCTOR DEVICE AND SEMICONDUCTOR DEVICE WITH COOLING MEMBER

(71) Applicant: Mitsubishi Electric Corporation, Tokyo (JP)

(72) Inventor: Takahiko Murakami, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 464 days.

(21) Appl. No.: 17/418,507

(22) PCT Filed: Mar. 15, 2019

(86) PCT No.: PCT/JP2019/010741
§ 371 (c)(1),
(2) Date: Jun. 25, 2021

(87) PCT Pub. No.: WO2020/188617
PCT Pub. Date: Sep. 24, 2020

(65) Prior Publication Data
US 2022/0068762 A1    Mar. 3, 2022

(51) Int. Cl.
*H01L 23/40*    (2006.01)
*H01L 23/29*    (2006.01)

(52) U.S. Cl.
CPC ........ *H01L 23/4006* (2013.01); *H01L 23/293* (2013.01)

(58) Field of Classification Search
CPC .................................................. H01L 23/4006
See application file for complete search history.

(56) References Cited

U.S. PATENT DOCUMENTS

| 4,907,124 A | * | 3/1990 | Kaufman | ............ H01L 23/4006 174/16.3 |
| 5,793,106 A | * | 8/1998 | Yasukawa | ........... H01L 23/3121 257/713 |

(Continued)

FOREIGN PATENT DOCUMENTS

| CN | 208534947 U | 2/2019 |
| JP | 56-81546 U | 11/1954 |

(Continued)

OTHER PUBLICATIONS

An Office Action; "Notice of Reasons for Refusal", mailed by the Japanese Patent Office on Sep. 13, 2022, which corresponds to Japanese Patent Application No. 2021-506786 and is related to U.S. Appl. No. 17/418,507; with English language translation.

(Continued)

*Primary Examiner* — David A Zarneke
(74) *Attorney, Agent, or Firm* — Studebaker & Brackett PC

(57) ABSTRACT

A semiconductor device includes a base plate, a case, and a collar. The base plate includes a metal or an alloy. The base plate has a first bolt hole. The case includes a resin. The case has a first main surface and a second main surface. The second main surface is in contact with the base plate. The case has a through-hole. The collar includes a metal or an alloy. The collar is located within the through-hole. The collar has a first end and a second end. The first end is located on a side where the first main surface is located. The second end is located on a side where the second main surface is located. The collar has a second bolt hole. The first end has a flange. Alternatively, the collar has an outer circumferential surface. The outer circumferential surface has a straight knurling.

22 Claims, 8 Drawing Sheets

(56) References Cited

U.S. PATENT DOCUMENTS

| | | | | |
|---|---|---|---|---|
| 9,521,737 | B2* | 12/2016 | Izuo | H05K 7/2039 |
| 9,711,430 | B2* | 7/2017 | Nishida | H01L 21/56 |
| 9,922,910 | B2* | 3/2018 | Otremba | H01L 23/4006 |
| 10,334,715 | B2* | 6/2019 | Al-Momani | H05K 3/301 |
| 10,677,262 | B2* | 6/2020 | Kinoshita | F04B 39/06 |
| 10,867,901 | B2* | 12/2020 | Miyasaka | H01L 23/49844 |
| 2016/0079155 | A1 | 3/2016 | Kawase et al. | |
| 2016/0258470 | A1 | 9/2016 | Sakoda | |

FOREIGN PATENT DOCUMENTS

| | | |
|---|---|---|
| JP | H03-32046 A | 2/1991 |
| JP | H09-129823 A | 5/1997 |
| JP | 2006-114641 A | 4/2006 |
| JP | 2017-187047 A | 10/2017 |
| WO | 2014181426 A1 | 11/2014 |

OTHER PUBLICATIONS

International Search Report issued in PCT/JP2019/010741; mailed May 28, 2019.

An Office Action; "Notice of Reasons for Refusal", mailed by the Japanese Patent Office on Mar. 8, 2022, which corresponds to Japanese Patent Application No. 2021-506786 and is related to U.S. Appl. No. 17/418,507; with English language translation.

An Office Action mailed by China National Intellectual Property Administration on Aug. 31, 2023, which corresponds to Chinese Patent Application No. 201980093908.2 and is related to U.S. Appl. No. 17/418,507; with English language translation.

An Office Action mailed by China National Intellectual Property Administration on Mar. 21, 2024, which corresponds to Chinese Application No. 201980093908.2 and is related to U.S. Appl. No. 17/418,507; with English language translation.

An Office Action mailed by the State Intellectual Property Office of the People's Republic of China on Jun. 14, 2024, which corresponds to Chinese application No. 201980093908.2 and is related to U.S. Appl. No. 17/418,507; with English language translation.

* cited by examiner

F I G. 3
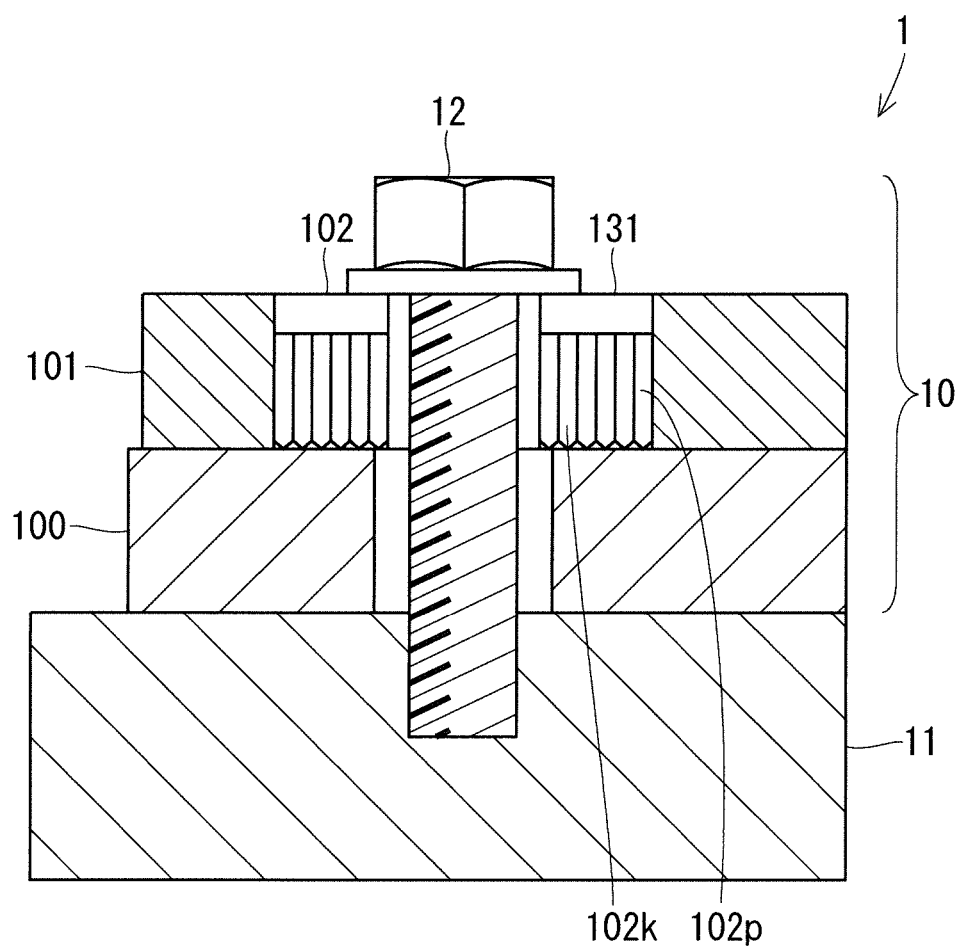

F I G. 7
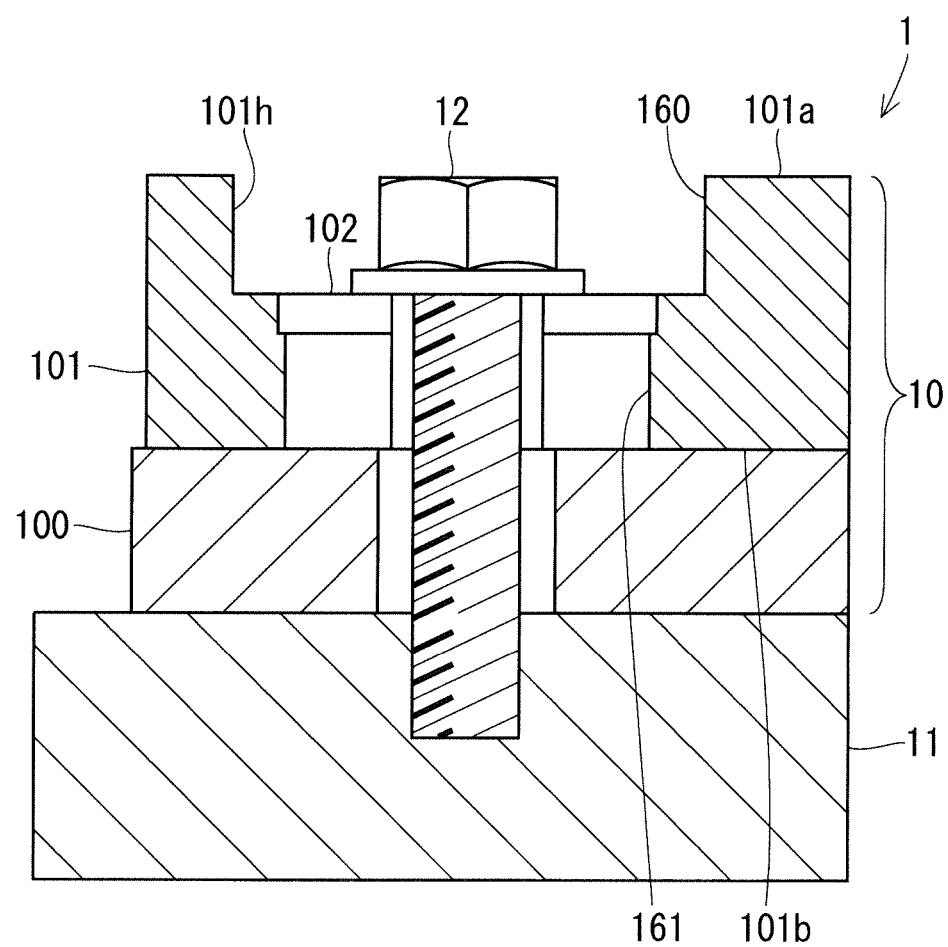

F I G. 8
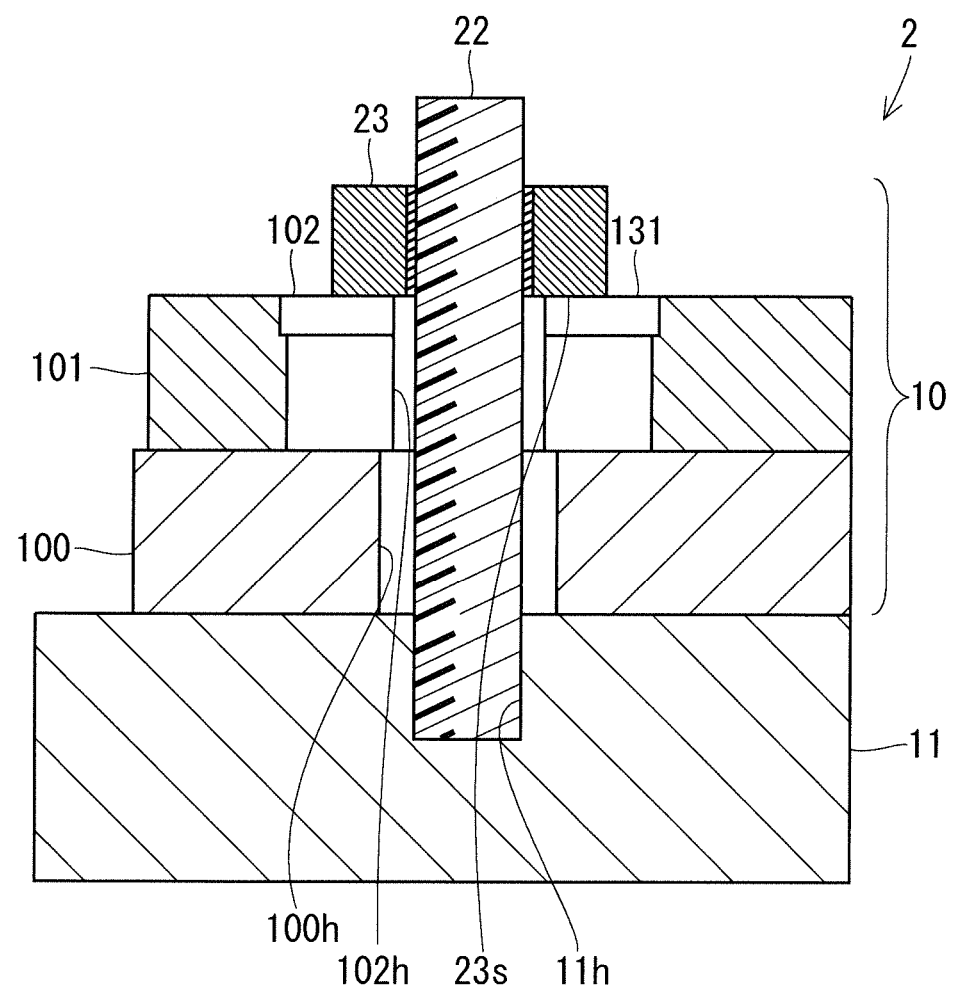

SEMICONDUCTOR DEVICE AND SEMICONDUCTOR DEVICE WITH COOLING MEMBER

TECHNICAL FIELD

The present invention relates to a semiconductor device and a semiconductor device with a cooling member.

BACKGROUND ART

Semiconductor devices for industrial, railroad, on-board, and other applications include semiconductor elements. Such a semiconductor device is secured to a cooling member, such as a cooling fin and a cooling jacket, to release heat generated by semiconductor elements. When the semiconductor device is secured to the cooling member, the semiconductor device and the cooling member are fastened by a bolt and the like in many cases.

The semiconductor device includes a base plate including a metal and a case including a resin in many cases. When the bolt is in contact with the case in a case where the semiconductor device and the cooling member are fastened by the bolt, a bolt contact surface of the case being in contact with the bolt creeps to reduce heat dissipation of the semiconductor device. A collar including a metal is thus attached to the case, and the semiconductor device and the cooling member are fastened by the bolt through the collar in many cases.

The collar sometimes has a flange to improve resistance to a pull out from the case. The flange is located at an end where the base plate is located to increase the area of contact between the base plate and the collar in many cases.

In a semiconductor device disclosed in Patent Document 1, an S-shaped metal cylinder is embedded in a resin of a resin case (paragraph 0007). A surface of the S-shaped metal cylinder being in contact with a metal base protrudes from a resin surface (paragraph 0007). A cavity of the S-shaped metal cylinder and a through-hole of the metal base serve as an attachment hole for attachment to external equipment with a screw (paragraph 0007). The S-shaped structure increases adhesion to the resin (paragraph 0008). The S-shaped structure can be formed by continuous drawing to allow for a low manufacturing cost and mass production (paragraph 0008). Since a leading end of the S-shaped metal cylinder protrudes from the resin case, an in-plane thickness of an adhesive can be maintained constant when the resin case and the metal base are caused to adhere to each other with the adhesive to thereby enhance an adhesion strength, and, since the S-shaped metal cylinder supports a screwing force, cracking of the resin case does not occur (paragraph 0008).

PRIOR ART DOCUMENT

Patent Document

Patent Document 1: Japanese Patent Application Laid-Open No. H9-129823

SUMMARY

Problem to be Solved by the Invention

The above-mentioned semiconductor device, however, has a problem in that the case is likely to be disengaged from a collar away from the base plate. The problem becomes noticeable, for example, when thermal stress is applied to the semiconductor device in a temperature cycling test and the like.

The present invention has been conceived to solve the problem. It is an object of the present invention to provide a semiconductor device enabling suppression of disengagement of a case from a collar away form a base plate.

Means to Solve the Problem

A semiconductor device includes a base plate, a case, and a collar.

The base plate includes a metal or an alloy. The base plate has a first bolt hole.

The case includes a resin. The case has a first main surface and a second main surface. The second main surface is opposite the first main surface, and is in contact with the base plate. The case has a through-hole. The through-hole extends from the first main surface to the second main surface.

The collar includes a metal or an alloy. The collar is located within the through-hole. The collar has a first end and a second end. The first end is located on a side where the first main surface is located. The second end is located on a side where the second main surface is located. The collar has a second bolt hole. The second bolt hole extends from the first end to the second end, and leads to the first bolt hole.

The first end has a flange. Alternatively, the collar has an outer circumferential surface. The outer circumferential surface extends from the first end to the second end. The outer circumferential surface has a straight knurling.

Effects of the Invention

According to the present invention, movement of the case away from the base plate is inhibited by the flange or knurls. Disengagement of the case from the collar away from the base plate can thereby be suppressed.

The objects, features, aspects, and advantages of the present invention will become more apparent from the following detailed description and the accompanying drawings.

BRIEF DESCRIPTION OF DRAWINGS

FIG. 3 is a cross-sectional view schematically showing a semiconductor device with a cooling member in a first modification of Embodiment 1.

FIG. 7 is a cross-sectional view schematically showing a semiconductor device with a cooling member in a fourth modification of Embodiment 1.

FIG. 8 is a cross-sectional view schematically showing a semiconductor device with a cooling member in Embodiment 2.

DESCRIPTION OF EMBODIMENTS

1 Embodiment 1

1.1 Semiconductor Device with Cooling Member

Figure 1:
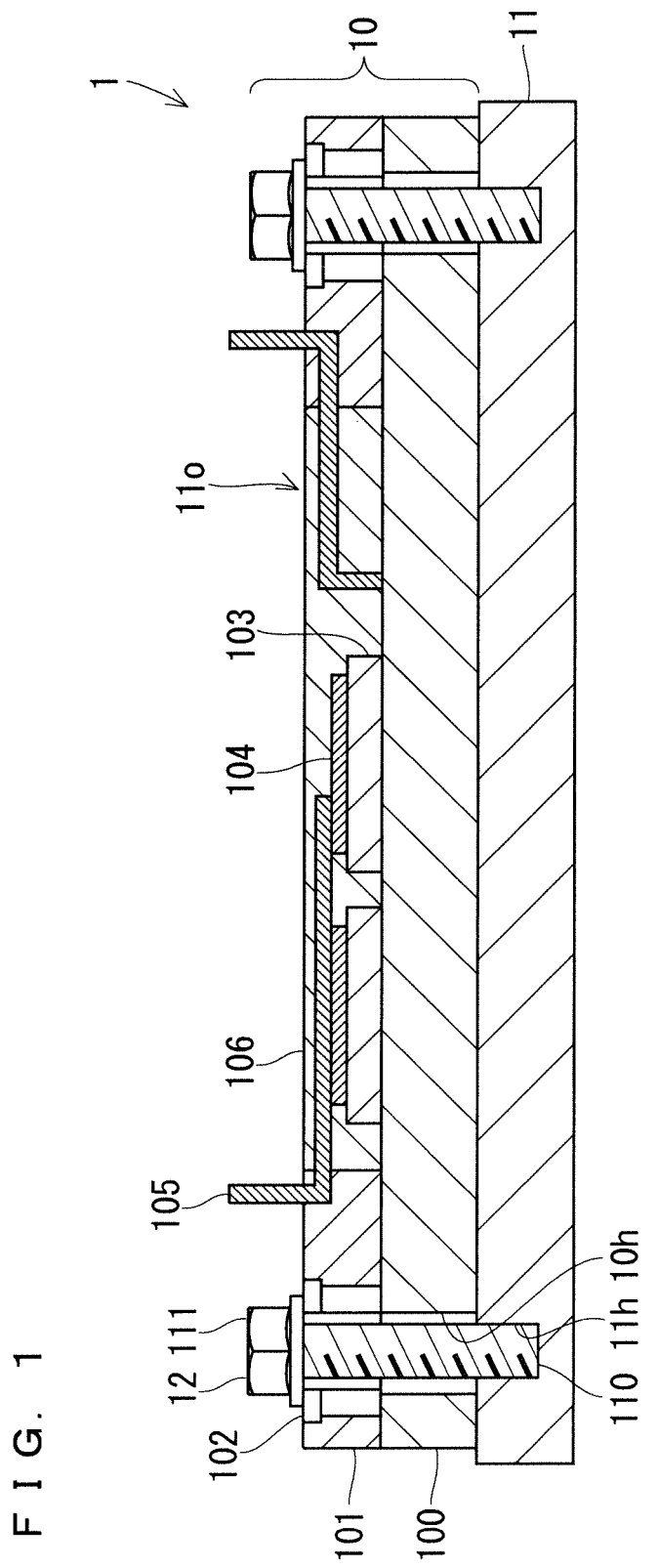
FIG. 1 is a cross-sectional view schematically showing a semiconductor device with a cooling member in Embodiment 1.

FIG. 1 is a cross-sectional view schematically showing a semiconductor device with a cooling member in Embodiment 1.

The semiconductor device with the cooling member 1 shown in FIG. 1 includes a semiconductor device 10, a cooling member 11, and a bolt 12.

The semiconductor device 10 is a semiconductor module, a semiconductor discrete component, and the like, and is preferably a power semiconductor module, a power semiconductor discrete component, and the like. The semiconductor device 10 has a bolt hole 10h.

The cooling member 11 is a cooling fin, a cooling jacket, and the like. The cooling member 11 has a bolt hole 11h.

The bolt 12 has a shank 110 and a head 111. The shank 110 passes through the bolt hole 10h, and threadably engages with the bolt hole 11h. The head 111 applies an axial force toward the cooling member 11 to the semiconductor device 10. The semiconductor device 10 and the cooling member 11 are thereby fastened by the bolt 12. The semiconductor device 10 is secured to the cooling member 11.

The semiconductor device 10 generates heat during operation. The generated heat is transferred to the cooling member 11. The cooling member 11 dissipates the transferred heat. The semiconductor device 10 is thereby cooled.

1.2 Semiconductor Device

Figure 2:
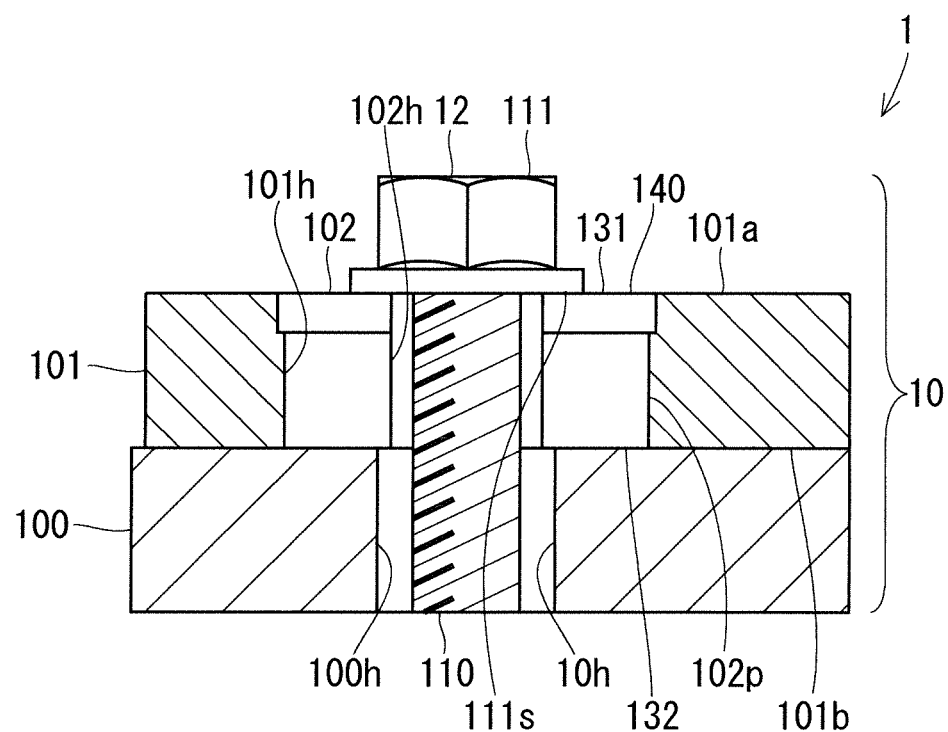
FIG. 2 is an enlarged cross-sectional view schematically showing the semiconductor device with the cooling member in Embodiment 1.

FIG. 2 is an enlarged cross-sectional view schematically showing the semiconductor device with the cooling member in Embodiment 1. FIG. 2 is an enlarged view of a vicinity of a collar of the semiconductor device with the cooling member in Embodiment 1.

As shown in FIGS. 1 and 2, the semiconductor device 10 includes a base plate 100, a case 101, and a collar 102. As shown in FIG. 1, the semiconductor device 10 also includes an insulating member 103, a semiconductor chip 104, an electrode 105, and a sealing material 106. The collar 102 is also referred to as a bushing and the like.

The base plate 100 includes a metal or an alloy. As shown in FIG. 2, the base plate 100 has a first bolt hole 100h.

The case 101 includes a resin. The case 101 is located on the base plate 100. As shown in FIG. 2, the case 101 has a first main surface 101a and a second main surface 101b. The second main surface 101b is opposite the first main surface 101a. The second main surface 101b is in contact with the base plate 100. As shown in FIG. 2, the case 101 has a through-hole 101h. The through-hole 101h extends from the first main surface 101a to the second main surface 101b. The case 101 is in the shape of a frame. The base plate 100 and the case 101 thus define a space 11o located on the base plate 100 and surrounded by the case 101 as shown in FIG. 1. The insulating member 103, the semiconductor chip 104, a main portion of the electrode 105, and the sealing material 106 are located within the space 11o. The case 101 holds the electrode 105.

The collar 102 includes a metal or an alloy. The collar 102 is attached to the case 101, and is located within the through-hole 101h. As shown in FIG. 2, the collar 102 has a first end 131 and a second end 132. The first end 131 is located on a side where the first main surface 101a of the case 101 is located. The second end 132 is located on a side where the second main surface 101b of the case 101 is located. As shown in FIG. 2, the collar 102 has a second bolt hole 102h. The second bolt hole 102h extends from the first end 131 to the second end 132, and leads to the first bolt hole 100h. As shown in FIG. 2, the first end 131 has a flange 140. As shown in FIG. 2, the collar 102 has an outer circumferential surface 102p. The outer circumferential surface 102p extends from the first end 131 to the second end 132.

The insulating member 103 is located on the base plate 100, and is joined to the base plate 100.

The semiconductor chip 104 is preferably a power semiconductor chip. The semiconductor chip 104 is located on the insulating member 103, and is joined to the insulating member 103. Accordingly, the semiconductor chip 104 is separated from the base plate 100 by the insulating member 103, and is electrically insulated from the base plate 100 by the insulating member 103.

The electrode 105 is joined to the semiconductor chip 104. The electrode 105 is thereby electrically connected to the semiconductor chip 104.

The sealing material 106 includes a gel, a potting resin, and the like. The space 11o is filled with the sealing material 106 to seal the semiconductor chip 104.

According to the semiconductor device with the cooling member 1 in Embodiment 1, movement of the case 101 away from the base plate 100 is inhibited by the flange 140. Disengagement of the case 101 from the collar 102 away from the base plate 100 can thereby be suppressed, for example, when thermal stress is applied to the semiconductor device with the cooling member 1 in a temperature cycling test and the like. That is to say, resistance to a pull out away from the base plate 100 can be improved.

The collar 102 is preferably a forging or a cutting, and manufactured by forging or cutting.

When the collar 102 is manufactured by drawing as disclosed in Patent Document 1, the collar 102 is cylindrical and thin-walled. The area of contact between the collar 102 and the base plate 100 is thus small, so that surface pressure of the axial force applied to the base plate 100 when the semiconductor device 10 and the cooling member 11 are fastened by the bolt 12 is high, and the base plate 100 can be buckled. Furthermore, a cavity can be formed within the collar 102 to reduce stiffness of the collar 102 to thereby deform the collar 102.

In contrast, when the collar 102 is manufactured by forging or cutting, a surface of the collar 102 opposing the base plate 100 except for the first bolt hole 100h is a bearing surface. The area of contact between the collar 102 and the base plate 100 is thus large, so that the surface pressure of the axial force applied to the base plate 100 when the semiconductor device 10 and the cooling member 11 are fastened by the bolt 12 is low, and the base plate 100 is less likely to be buckled. Furthermore, stiffness of the collar 102 is improved, and the collar 102 is less likely to be deformed.

The second end 132 of the collar 102 and the second main surface 101b of the case 101 are flush with each other, and have no step.

When the second end 132 of the collar 102 protrudes from the second main surface 101b of the case 101 as disclosed in Patent Document 1, the area of contact between the case 101 and the base plate 100 is small, and it is difficult for the case 101 to suppress deformation of the base plate 100 due to thermal stress, so that the base plate 100 can be deformed to reduce reliability of the semiconductor device with the cooling member 1 when the temperature cycling test is conducted with the semiconductor device 10 and the cooling member 11 fastened by the bolt 12. For example, a water leakage from the semiconductor device with the cooling member 1 can occur.

In contrast, when the second end 132 of the collar 102 and the second main surface 101b of the case 101 are flush with each other, substantially all the surface of the base plate 100 is in contact with the case 101, and is held by the case 101, so that deformation of the base plate 100 due to thermal stress can be suppressed by the case 101.

The case 101 and the collar 102 are preferably an integral molding, and manufactured by insert molding. Adhesion of the case 101 and the collar 102 to each other can thereby be improved, and resistance to the pull out can further be improved.

In the semiconductor device with the cooling member 1 in Embodiment 1, the shank 110 of the bolt 12 passes through the first bolt hole 100h and the second bolt hole 102h, and threadably engages with the third bolt hole 11h. The head 111 of the bolt 12 applies the axial force to the collar 102. The head 111 of the bolt 12 has a bearing surface 111s. The first end 131 of the collar 102 is in contact with the bearing surface 111s as a whole.

Figure 4:
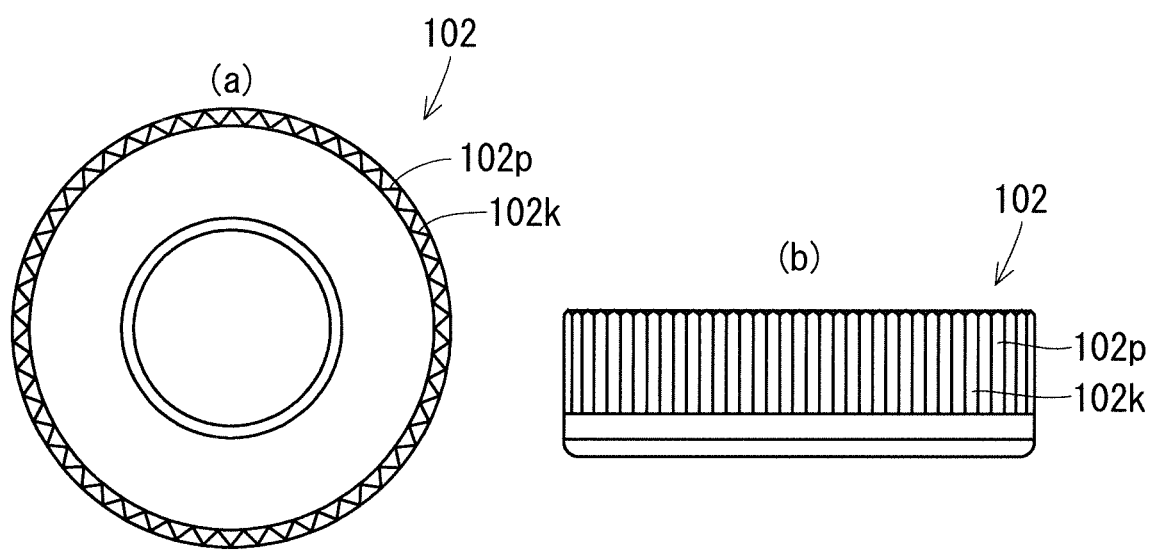
FIG. 4 schematically shows a collar of the semiconductor device with the cooling member in the first modification of Embodiment 1.

FIG. 3 is a cross-sectional view schematically showing a semiconductor device with a cooling member in a first modification of Embodiment 1. FIG. 4 schematically shows a collar of the semiconductor device with the cooling member in the first modification of Embodiment 1. Part (a) of FIG. 4 is a top view. Part (b) of FIG. 4 is a side view.

The collar 102 shown in FIGS. 3 and 4 differs from the collar 102 shown in FIGS. 1 and 2 mainly in the following respect.

In the collar 102 shown in FIGS. 1 and 2, the first end 131 of the collar 102 has the flange 140. In contrast, in the collar 102 shown in FIGS. 3 and 4, the first end 131 of the collar 102 does not have the flange 140. The outer circumferential surface 102p of the collar 102 has a straight knurling 102k. The straight knurling 102k has knurls. The knurls each preferably have a depth of 0.5 mm or more.

According to the semiconductor device with the cooling member 1 in the first modification of Embodiment 1, movement of the case 101 away from the base plate 100 is inhibited by the knurls. Disengagement of the case 101 from the collar 102 away from the base plate 100 can thereby be suppressed, for example, when thermal stress is applied to the semiconductor device with the cooling member 1 in the temperature cycling test and the like. That is to say, resistance to the pull out away from the base plate 100 can be improved.

According to the semiconductor device with the cooling member 1 in the first modification of Embodiment 1, circumferential rotation of the collar 102 is inhibited by the straight knurling 102k. The circumferential rotation of the collar 102 can thereby be suppressed.

Figure 5:
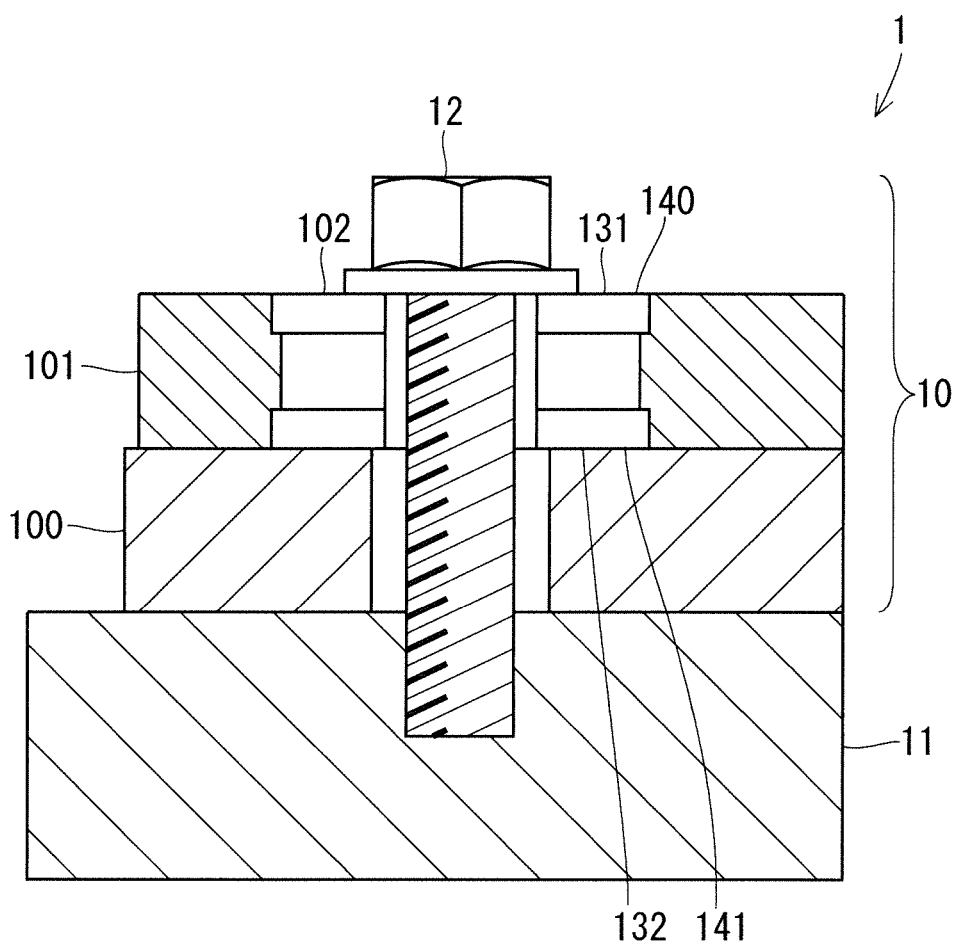
FIG. 5 is a cross-sectional view schematically showing a semiconductor device with a cooling member in a second modification of Embodiment 1.

FIG. 5 is a cross-sectional view schematically showing a semiconductor device with a cooling member in a second modification of Embodiment 1.

The collar 102 shown in FIG. 5 differs from the collar 102 shown in FIGS. 1 and 2 mainly in the following respect.

In the collar 102 shown in FIGS. 1 and 2, the first end 131 of the collar 102 has the flange 140. In contrast, in the collar 102 shown in FIG. 5, the first end 131 of the collar 102 has the first flange 140. Furthermore, the second end 132 of the collar 102 has a second flange 141.

According to the semiconductor device with the cooling member 1 in the second modification of Embodiment 1, disengagement of the case 101 from the collar 102 away from the base plate 100 can be suppressed as with the semiconductor device with the cooling member 1 in Embodiment 1.

Furthermore, according to the semiconductor device with the cooling member 1 in the second modification of Embodiment 1, disengagement of the case 101 from the collar 102 toward the base plate 100 can be suppressed. That is to say, resistance to a pull out toward the base plate 100 can be improved.

Figure 6:
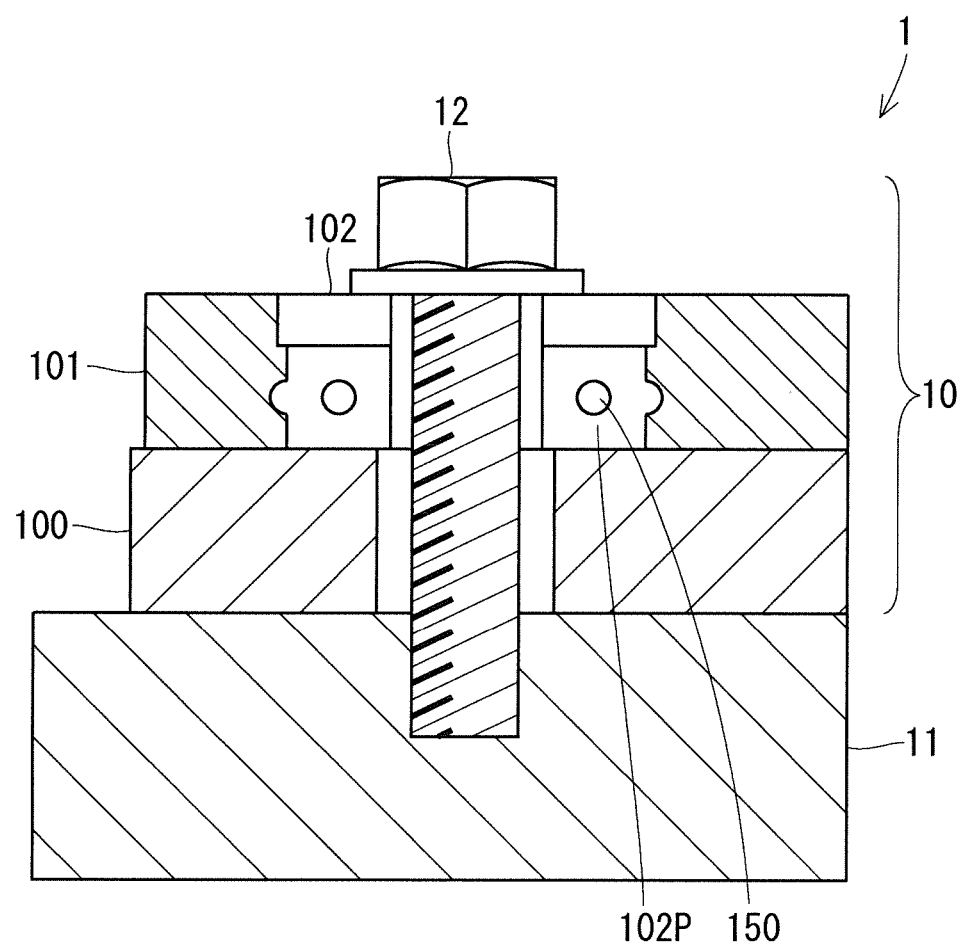
FIG. 6 is a cross-sectional view schematically showing a semiconductor device with a cooling member in a third modification of Embodiment 1.

FIG. 6 is a cross-sectional view schematically showing a semiconductor device with a cooling member in a third modification of Embodiment 1.

The collar 102 shown in FIG. 6 differs from the collar 102 shown in FIGS. 1 and 2 mainly in the following respect.

The collar 102 shown in FIGS. 1 and 2 has no protrusions on the outer circumferential surface 102p. In contrast, the collar 102 shown in FIG. 6 has protrusions 150 on the outer circumferential surface 102p.

According to the semiconductor device with the cooling member 1 in the third modification of Embodiment 1, disengagement of the case 101 from the collar 102 away from the base plate 100 can be suppressed as with the semiconductor device with the cooling member 1 in Embodiment 1.

Furthermore, according to the semiconductor device with the cooling member 1 in the third modification of Embodiment 1, the circumferential rotation of the collar 102 is inhibited by the protrusions 150. The circumferential rotation of the collar 102 can thereby be suppressed.

FIG. 7 is a cross-sectional view schematically showing a semiconductor device with a cooling member in a fourth modification of Embodiment 1.

The case 101 shown in FIG. 7 differs from the case 101 shown in FIGS. 1 and 2 mainly in the following respect.

In the case 101 shown in FIGS. 1 and 2, the through-hole 101h has a generally constant diameter. In contrast, in the case 101 shown in FIG. 7, the through-hole 101h includes a counterbore hole 160 and a receiving hole 161. The counterbore hole 160 is located on a side of the first main surface 101a of the case 101. The receiving hole 161 is located on a side of the second main surface 101b of the case 101. The receiving hole 161 leads to the counterbore hole 160. The receiving hole 161 receives the collar 102.

According to the semiconductor device with the cooling member 1 in the fourth modification of Embodiment 1, disengagement of the case 101 from the collar 102 away from the base plate 100 can be suppressed as with the semiconductor device with the cooling member 1 in Embodiment 1.

Furthermore, according to the semiconductor device with the cooling member 1 in the fourth modification of Embodiment 1, the case 101 can be thick-walled to improve stiffness of the case 101.

2 Embodiment 2

FIG. 8 is a cross-sectional view schematically showing a semiconductor device with a cooling member in Embodiment 2.

The semiconductor device with the cooling member 2 in Embodiment 2 shown in FIG. 8 differs from the semiconductor device with the cooling member 1 in Embodiment 1 shown in FIGS. 1 and 2 mainly in the following respect.

In the semiconductor device with the cooling member in Embodiment 1, the shank 110 of the bolt 12 passes through the first bolt hole 100h and the second bolt hole 102h, and threadably engages with the third bolt hole 11h, The head 111 of the bolt 12 applies the axial force to the collar 102. The head 111 of the bolt 12 has the bearing surface 111s. The first end 131 of the collar 102 is in contact with the bearing surface 111s as a whole.

In contrast, in the semiconductor device with the cooling member 2 in Embodiment 2, a stud bolt 22 passes through the first bolt hole 100h and the second bolt hole 102h, and threadably engages with the third bolt hole 11h. A nut 23 threadably engaged with the stud bolt 22 applies the axial force to the collar 102. The nut 23 has a bearing surface 23s. The first end 131 of the collar 102 is in contact with the bearing surface 23s as a whole.

According to the semiconductor device with the cooling member 2 in Embodiment 2, disengagement of the case 101 from the collar 102 away from the base plate 100 can be suppressed as with the semiconductor device with the cooling member 1 in Embodiment 1.

Furthermore, according to the semiconductor device with the cooling member 2 in Embodiment 2, positioning at assembly of the semiconductor device with the cooling member 2 is easy.

Embodiments of the present invention can freely be combined with each other, and can be modified or omitted as appropriate within the scope of the invention.

While the invention has been described in detail, the foregoing description is in all aspects illustrative and not restrictive. It is therefore understood that numerous modifications not having been described can be devised without departing from the scope of the invention.

EXPLANATION OF REFERENCE SIGNS

1, 2 semiconductor device with cooling member, 10 semiconductor device, 11 cooling member, 12 bolt, 22 stud bolt, 23 nut, 100 base plate, 101 case, 102 collar, 102k straight knurling, 140 flange (first flange), 141 second flange, 150 protrusion.

The invention claimed is:

1. A semiconductor device comprising:
a base plate comprising a metal or an alloy, and having a first bolt hole;
a case comprising a resin, having a first main surface and a second main surface opposite the first main surface and in contact with the base plate, and having a through-hole extending from the first main surface to the second main surface; and
a collar comprising a metal or an alloy, located within the through-hole, having a first end located on a side where the first main surface is located and a second end located on a side where the second main surface is located, and having a second bolt hole extending from the first end to the second end and leading to the first bolt hole, the first end having a flange.

2. The semiconductor device according to claim 1, wherein
the flange is a first flange, and
the second end has a second flange.

3. The semiconductor device according to claim 1, wherein
the collar is a forging or a cutting.

4. The semiconductor device according to claim 1, wherein
the second end and the second main surface are flush with each other.

5. The semiconductor device according to claim 1, wherein
the through-hole includes:
a counterbore hole located on a side of the first main surface; and
a receiving hole located on a side of the second main surface, leading to the counterbore hole, and receiving the collar.

6. The semiconductor device according to claim 1, wherein
the case and the collar are an integral molding.

7. The semiconductor device according to claim 1, wherein
the collar has an outer circumferential surface extending from the first end to the second end, the outer circumferential surface having a protrusion.

8. A semiconductor device with a cooling member comprising:
the semiconductor device according to claim 1;
the cooling member having a third bolt hole; and
a bolt having a shank and a head, the shank passing through the first bolt hole and the second bolt hole and threadably engaging with the third bolt hole, the head applying an axial force to the collar.

9. The semiconductor device with the cooling member according to claim 8, wherein
the head has a bearing surface, and
the first end is in contact with the bearing surface as a whole.

10. A semiconductor device with a cooling member comprising:
the semiconductor device according to claim 1;
the cooling member having a third bolt hole;
a stud bolt passing through the first bolt hole and the second bolt hole and threadably engaging with the third bolt hole; and
a nut threadably engaged with the stud bolt and applying an axial force to the collar.

11. The semiconductor device with the cooling member according to claim 10, wherein
the nut has a bearing surface, and
the first end is in contact with the bearing surface as a whole.

12. A semiconductor device comprising:
a base plate comprising a metal or an alloy, and having a first bolt hole;
a case comprising a resin, having a first main surface and a second main surface opposite the first main surface and in contact with the base plate, and having a through-hole extending from the first main surface to the second main surface; and
a collar comprising a metal or an alloy, located within the through-hole, having a first end located on a side where the first main surface is located and a second end located on a side where the second main surface is located, having a second bolt hole extending from the first end to the second end and leading to the first bolt hole, and having an outer circumferential surface extending from the first end to the second end, the outer circumferential surface having a straight knurling.

13. The semiconductor device according to claim 12, wherein
the straight knurling has a knurl having a depth of 0.5 mm or more.

14. The semiconductor device according to claim 12, wherein
the collar is a forging or a cutting.

15. The semiconductor device according to claim 12, wherein
the second end and the second main surface are flush with each other.

16. The semiconductor device according to claim 12, wherein
the through-hole includes:
  a counterbore hole located on a side of the first main surface; and
  a receiving hole located on a side of the second main surface, leading to the counterbore hole, and receiving the collar.

17. The semiconductor device according to claim 12, wherein
the case and the collar are an integral molding.

18. The semiconductor device according to claim 12, wherein
the collar has an outer circumferential surface extending from the first end to the second end, the outer circumferential surface having a protrusion.

19. A semiconductor device with a cooling member comprising:
the semiconductor device according to claim 12;
the cooling member having a third bolt hole; and
a bolt having a shank and a head, the shank passing through the first bolt hole and the second bolt hole and threadably engaging with the third bolt hole, the head applying an axial force to the collar.

20. The semiconductor device with the cooling member according to claim 19, wherein
the head has a bearing surface, and
the first end is in contact with the bearing surface as a whole.

21. A semiconductor device with a cooling member comprising:
the semiconductor device according to claim 12;
the cooling member having a third bolt hole;
a stud bolt passing through the first bolt hole and the second bolt hole and threadably engaging with the third bolt hole; and
a nut threadably engaged with the stud bolt and applying an axial force to the collar.

22. The semiconductor device with the cooling member according to claim 21, wherein
the nut has a bearing surface, and
the first end is in contact with the bearing surface as a whole.

* * * * *